(12) United States Patent
Kawakubo

(10) Patent No.: US 7,301,260 B2
(45) Date of Patent: Nov. 27, 2007

(54) BULK ACOUSTIC WAVE DEVICE AND METHOD OF MANUFACTURING THE SAME

(75) Inventor: Takashi Kawakubo, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 726 days.

(21) Appl. No.: 10/736,830

(22) Filed: Dec. 17, 2003

(65) Prior Publication Data

US 2004/0125970 A1 Jul. 1, 2004

(30) Foreign Application Priority Data

Dec. 27, 2002 (JP) ............................. 2002-381581
Dec. 2, 2003 (JP) ............................. 2003-402714

(51) Int. Cl.
*H01L 41/08* (2006.01)

(52) U.S. Cl. ...................................... 310/324; 310/320

(58) Field of Classification Search ................ 310/320, 310/324

See application file for complete search history.

(56) References Cited

U.S. PATENT DOCUMENTS

| | | | |
|---|---|---|---|
| 6,060,818 A | 5/2000 | Ruby et al. | |
| 6,242,842 B1 | 6/2001 | Pahl et al. | |
| 6,449,828 B2 | 9/2002 | Pahl et al. | |
| 6,732,415 B2 * | 5/2004 | Nakatani et al. | 29/25.35 |
| 6,778,038 B2 * | 8/2004 | Takeishi et al. | 333/133 |
| 6,914,367 B2 | 7/2005 | Furukawa | |
| 6,930,437 B2 * | 8/2005 | Nakatani et al. | 310/324 |
| 6,961,245 B2 * | 11/2005 | Ikuta et al. | 361/719 |
| 7,053,456 B2 * | 5/2006 | Matsuo | 257/415 |
| 7,187,253 B2 * | 3/2007 | Sano et al. | 333/187 |

2004/0201305 A1  10/2004  Aigner et al.

FOREIGN PATENT DOCUMENTS

| | | |
|---|---|---|
| JP | 61-218214 | 9/1986 |
| JP | 64-41309 | 2/1989 |
| JP | 6-295181 | 10/1994 |
| JP | 9-83029 | 3/1997 |
| JP | 11-502974 | 3/1999 |
| JP | 2002-16466 | 1/2002 |
| JP | 2002-314368 | 10/2002 |
| WO | WO 02/05424 A1 | 1/2002 |
| WO | WO 03/030358 A1 | 4/2003 |

OTHER PUBLICATIONS

U.S. Appl. No. 11/043,257, filed Jan. 27, 2005, Sano et al.

* cited by examiner

*Primary Examiner*—Mark Budd
(74) *Attorney, Agent, or Firm*—Oblon, Spivak, McClelland, Maier & Neustadt, P.C.

(57) ABSTRACT

A bulk acoustic wave device includes: a bulk acoustic wave element including a piezoelectric layer formed on a substrate, a lower electrode contacting a lower surface of the piezoelectric layer, and an upper electrode contacting an upper surface of the piezoelectric layer and partially overlapping the lower electrode, a lower hollow section being formed between the substrate and the lower surface of the piezoelectric layer, a first through-hole reaching the lower hollow section being formed through the bulk acoustic wave element in a direction perpendicular to a surface of the piezoelectric layer; an upper hollow section forming layer forming an upper hollow section with the upper surface of the piezoelectric layer, a second through-hole reaching the upper hollow section being formed therethrough in a direction perpendicular to a surface thereof; and a sealing layer covering the upper hollow section forming layer and filling up the second through-hole.

12 Claims, 18 Drawing Sheets

BULK ACOUSTIC WAVE DEVICE AND METHOD OF MANUFACTURING THE SAME

CROSS-REFERENCE TO RELATED APPLICATIONS

This application is based upon and claims the benefit of priority from prior Japanese Patent Applications No. 2002-381581, filed on Dec. 27, 2002 in Japan, and No. 2003-402714, filed on Dec. 2, 2003 in Japan, the entire contents of which are incorporated herein by reference.

BACKGROUND OF THE INVENTION

1. Field of the Invention

The present invention relates to a bulk acoustic wave device using thickness longitudinal vibrations of a piezoelectric thin film, which is applicable in a high-frequency filter or a high-frequency oscillator. More specifically, the present invention relates to a bulk acoustic wave device which is hermetically sealed on a substrate by means of a protection layer, and a method of manufacturing such a bulk acoustic wave device.

2. Related Art

A bulk acoustic wave (BAW) element, or a thin film bulk acoustic wave resonator (so called FBAR), using thickness longitudinal vibrations of a piezoelectric layer is regarded as a promising element to be applied to an RF filter in mobile radio communication or a voltage-controlled oscillator, since with such an element, it is possible to obtain a high excitation efficiency and a sharp resonance characteristic in a frequency band on the order of GHz or higher, with very small dimensions.

In a bulk acoustic wave device, the resonance frequency is determined based on the degree of acoustic velocity and thickness of piezoelectric material used. Generally, a thickness of 1 μm-2 μm corresponds to 2 GHz, and a thickness of 0.4 μm-0.8 μm corresponds to 5 GHz. In this manner, it is possible to cope with a high frequency up to several tens of GHz.

It is possible to form an RF filter of a mobile communication device with a plurality of bulk acoustic wave devices including the aforementioned bulk acoustic wave elements by arranging the bulk acoustic wave devices in series and in parallel to form a ladder filter as shown in FIG. 10. Furthermore, it is possible to form a voltage controlled oscillator (VCO) of a mobile communication device by combining a bulk acoustic wave device, a variable capacitance diode, and an amplifier, as shown in FIG. 11.

The performance of a bulk acoustic wave element can be shown by an electromechanical coupling factor $k_t^2$ and a quality factor Q. As the electromechanical coupling factor becomes higher, a filter or VCO having a wider band can be formed. In order to increase the electromechanical coupling factor, a material having a higher electromechanical coupling factor, which is inherent to its crystal, should be used, and the polarization axis of crystal should be aligned along the thickness direction of the layer. The quality factor Q relates to an insertion loss at the time a filter is formed, or the accuracy of the oscillations from an oscillator. Various phenomena to absorb elastic waves are related to Q, and it is possible to obtain a larger Q by improving the purity of crystal, aligning the crystal orientation, and using a piezoelectric layer having aligned polarization.

For example, Japanese Patent Laid-Open Publication No. 2000-69594 discloses a conventional and typical bulk acoustic wave device. FIGS. 12-16 show the structure and the method of manufacturing this bulk acoustic wave device. First, as shown in FIG. 12, a recess 52 is formed on a silicon substrate 51 by anisotropic etching, and then the surface of the silicon substrate 51 is covered by an insulating layer 53. Thereafter, a hollow section forming layer 55, which is easy to etch, e.g., a silicate glass to which boron or phosphorus is doped (boron-phosphorus silicate glass=BPSG), is formed on the substrate 51, as shown in FIG. 13. Subsequently, the workpiece is polished until the surface of the insulating layer 53 is exposed, and then the surface is flattened. As a result, the hollow section forming layer 55 is left only in the recess 52, as shown in FIG. 14.

Then, a lower electrode layer, a piezoelectric layer, and an upper electrode layer are sequentially deposited and patterned, thereby forming a bulk acoustic wave element 60 including a lower electrode 60b, a piezoelectric layer 60a, and an upper electrode 60c formed on the hollow section forming layer 55, as shown in FIG. 15.

Subsequently, a through-hole (not shown) reaching the hollow section forming layer 55 is formed through the bulk acoustic wave element 60, thereby removing the hollow section forming layer 55 by selective etching, as shown in FIG. 16. Through this process, the bulk acoustic wave element is formed.

The resonating part of the bulk acoustic wave element 60, composed of the piezoelectric layer 60a and the upper and lower electrodes 60b and 60c, should be hermetically sealed in a package formed of alumina, etc., since it is necessary to sandwich the resonating part with air layers in order to trap vibration energy. FIG. 17 shows an example of such a hermetically-sealed package. A bulk acoustic wave element 60 is connected to an alumina substrate 71 with wire bonding 73, and then the substrate 71 is connected to a cover 77 formed of alumina with solder 75, thereby hermetically sealing the bulk acoustic wave element 60.

As described above, it is necessary for the conventional bulk acoustic wave device to have air layers above the upper electrode 60c and below the lower electrode 60b in order to trap vibration energy between the upper and lower electrodes. In addition, it is necessary to seal the entire device in order to protect the electrode layers, etc. from the outside environment. The air layer below the lower electrode 60b can be formed by first making a hollow section forming layer 55 and then removing it by selective etching, as shown in FIGS. 12 to 16. The air layer above the upper electrode 60c is formed, however, by sealing the workpiece in the package of alumina, etc., as shown in FIG. 17. Since the structure of the package is complicated, the entire cost tends to increase. In addition, there is a problem in that the size of the package becomes rather large.

SUMMARY OF THE INVENTION

A bulk acoustic wave device according to a first aspect of the present invention includes: a bulk acoustic wave element including a piezoelectric layer formed on a substrate, a lower electrode contacting a lower surface of the piezoelectric layer, and an upper electrode contacting an upper surface of the piezoelectric layer and partially overlapping the lower electrode, a lower hollow section being formed between the substrate and the lower surface of the piezoelectric layer, a first through-hole reaching the lower hollow section being formed through the bulk acoustic element in a direction perpendicular to a surface of the piezoelectric layer; an upper hollow section forming layer forming an upper hollow section with the upper surface of the piezoelectric layer, a second through-hole reaching the upper hollow section being formed therethrough in a direction perpendicular to a surface thereof; and a sealing layer covering the upper hollow section forming layer and filling up the second through-hole.

A bulk acoustic wave device according to a second aspect of the present invention includes: a bulk acoustic wave element including a piezoelectric layer formed on a substrate, on which a recess is formed, a lower electrode contacting a lower surface of the piezoelectric layer, and an upper electrode contacting an upper surface of the piezoelectric layer and partially overlapping the lower electrode, a lower hollow section being formed between the recess of the substrate and the lower surface of the piezoelectric layer, a first through-hole reaching the lower hollow section being formed through the bulk acoustic wave element in a direction perpendicular to a surface of the piezoelectric layer; an upper hollow section forming layer forming an upper hollow section with the upper surface of the piezoelectric layer, a second through-hole reaching the upper hollow section being formed therethrough in a direction perpendicular to a surface thereof; and a sealing layer covering the upper hollow section forming layer and filling up the second through-hole.

A bulk acoustic wave device according to a third aspect of the present invention includes: an acoustic reflection layer formed on a substrate; a bulk acoustic wave element including a piezoelectric layer covering the acoustic reflection layer, a lower electrode contacting a lower surface of the piezoelectric layer, and an upper electrode contacting an upper surface of the piezoelectric layer and partially overlapping the lower electrode; a hollow section forming layer forming a hollow section with the upper surface of the piezoelectric layer, a through-hole reach the hollow section being formed in a direction perpendicular to a surface of the hollow section forming layer; and a sealing layer covering the hollow section forming layer and filling up the through-hole.

A method of manufacturing a bulk acoustic wave device according to a fourth aspect of the present invention includes: forming a first hollow section forming layer on a substrate; forming a lower electrode so as to cover a part of the first hollow section forming layer; forming a piezoelectric layer covering the lower electrode and the first hollow section forming layer and having a first through-hole reaching the first hollow section forming layer, the first through-hole extending in a direction perpendicular to a surface of the piezoelectric layer; forming an upper electrode covering a part of the piezoelectric layer and partially overlapping the lower electrode; forming a second hollow section forming layer covering the piezoelectric layer and the upper electrode; forming an upper hollow section forming layer covering the second hollow section forming layer and having a second through-hole reaching the second hollow section forming layer in a direction perpendicular to a surface of the upper hollow section forming layer; selectively removing the first and second hollow section forming layers via the first and second through-holes; and forming a sealing layer covering the upper hollow section forming layer and filling up the second through-hole.

A method of manufacturing a bulk acoustic wave device according to a fifth aspect of the present invention includes: forming a recess on a substrate; forming a first hollow section forming layer embedded in the recess of the substrate; forming a lower electrode covering at least a part of the first hollow section forming layer; forming a piezoelectric layer covering the lower electrode and the first hollow section forming layer, and having a first through-hole extending in a direction perpendicular to a surface of the piezoelectric layer and reaching the first hollow section forming layer; forming an upper electrode covering a part of the piezoelectric layer and partially overlapping the lower electrode; forming a second hollow section forming layer covering the piezoelectric layer and the upper electrode; forming an upper hollow section forming layer covering the second hollow section forming layer, and having a second through-hole extending in a direction perpendicular to a surface of the upper hollow section forming layer and reaching the second hollow section forming layer; selectively removing the first and second hollow section forming layers via the first and second throughholes; and forming a sealing layer covering the upper hollow section forming layer and filling up the second through-hole.

A method of manufacturing a bulk acoustic wave device according to a sixth aspect of the present invention includes: forming a recess on a substrate; forming an acoustic reflection layer embedded in the recess of the substrate; forming a lower electrode covering at least a part of the acoustic reflection layer; forming a piezoelectric layer covering the lower electrode and the acoustic reflection layer; forming an upper electrode covering a part of the piezoelectric layer and partially overlapping the lower electrode; forming a hollow section forming layer covering the piezoelectric layer and the upper electrode; forming a hollow section forming layer covering the hollow section forming layer, and having a through-hole extending in a direction perpendicular to a surface of the hollow section forming layer and reaching the hollow section forming layer; selectively removing the hollow section forming layer via the through-hole; and forming a sealing layer covering the hollow section forming layer and filling up the through-hole.

DESCRIPTION OF THE EMBODIMENTS

Hereinafter, embodiments of the present invention will be described in detail with reference to the accompanying drawings.

First Embodiment

Figure 1:
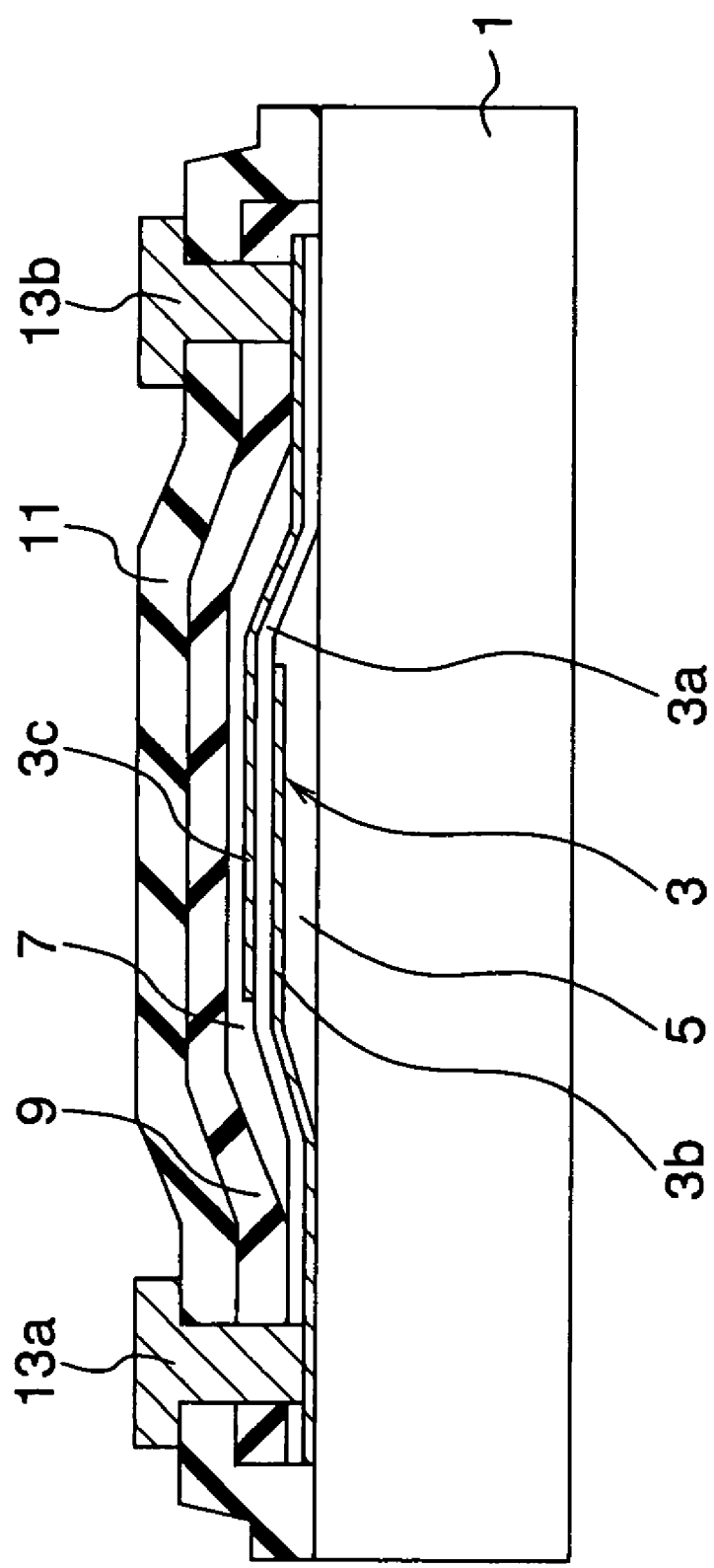
FIG. 1 is a sectional view showing the structure of a bulk acoustic wave device according to the first embodiment of the present invention.
Figure 2:
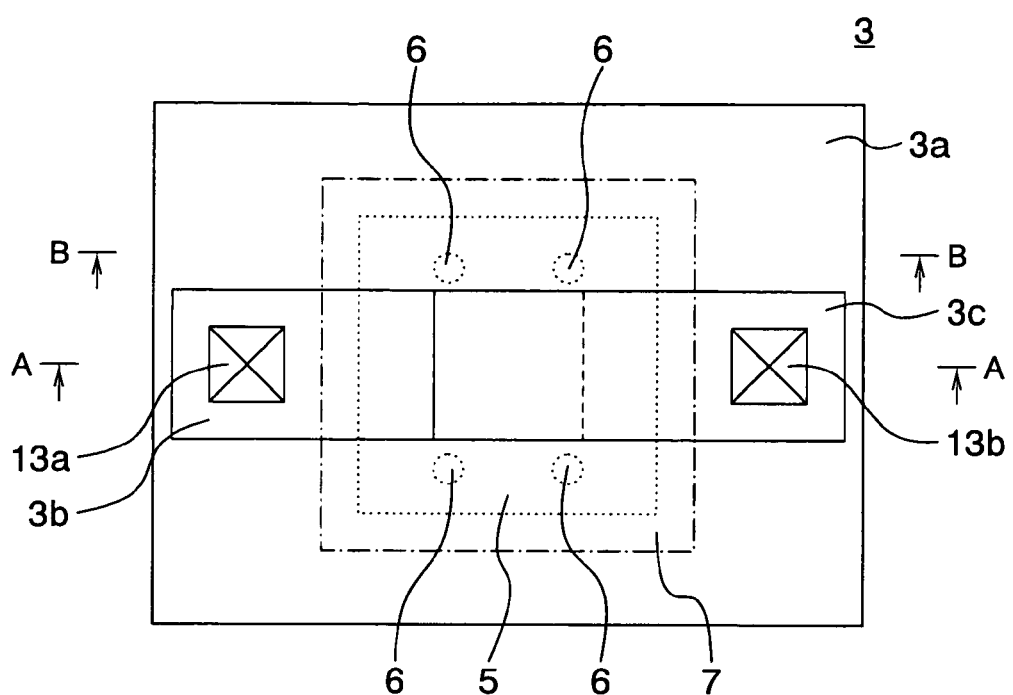
FIG. 2 is a plan view of a bulk acoustic wave element of the bulk acoustic wave device according to the first embodiment of the present invention.

FIG. 1 shows the structure of a bulk acoustic wave device according to the first embodiment of the present invention. The bulk acoustic wave device includes a bulk acoustic wave element 3, a plan view of which is shown in FIG. 2. FIG. 1 is a sectional view taken along line A-A of FIG. 2.

The bulk acoustic wave device in this embodiment includes a bulk acoustic wave element 3 formed on an insulating substrate 1 so as to have a lower hollow section 5 therebetween, an upper hollow section forming layer 9 formed on the bulk acoustic wave element 3 so as to have an upper hollow section 7 therebetween, a sealing layer 11 formed on the upper hollow section forming layer 9, and electrodes 13a and 13b. The bulk acoustic wave element 3 includes a piezoelectric layer 3a, a lower electrode 3b formed at the lower hollow section side, and an upper electrode 3c formed at the upper hollow section side.

Figure 3:
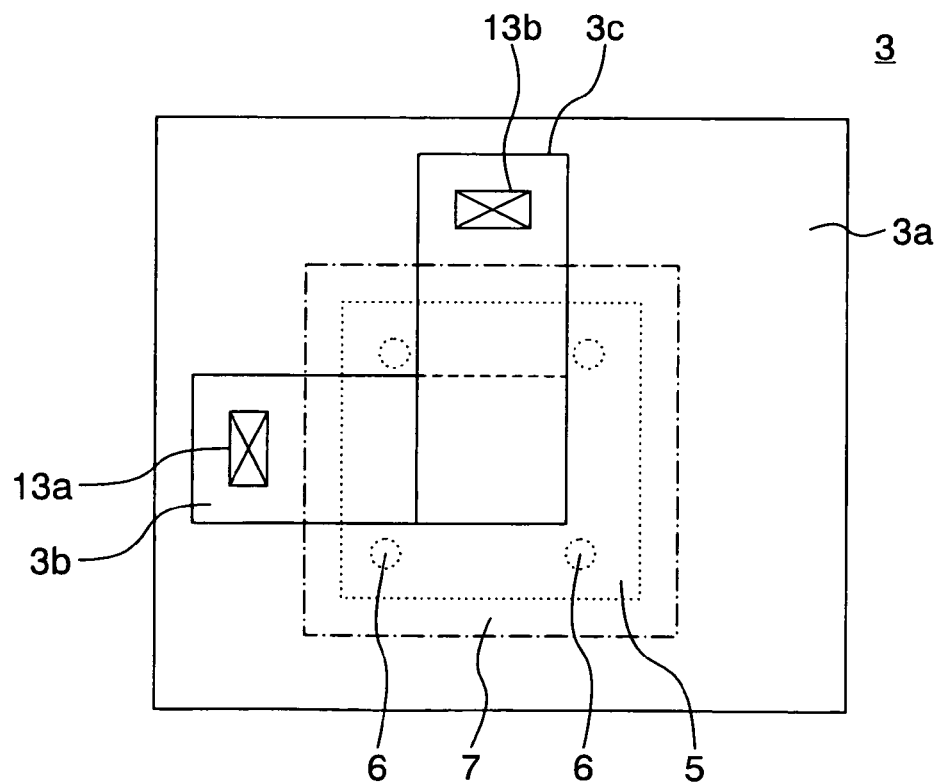
FIG. 3 is a plan view of another bulk acoustic wave element of the bulk acoustic wave device according to the first embodiment of the present invention.

In order to form the lower hollow section 5 between the piezoelectric layer 3a and the insulating substrate 1, the edge portions of the piezoelectric layer 3a are formed along the insulating substrate 1, and the piezoelectric layer 3a is spaced incrementally apart from the insulating substrate 1 from the edge portions toward the central portion. The central portion is flat and is located at a predetermined distance from the insulating substrate 1. The lower electrode 3b extends from one end portion to the central portion of the piezoelectric layer 3a along a surface thereof at the lower hollow section side (FIGS. 1 and 2). The upper electrode 3c extends from the other end portion to the central portion of the piezoelectric layer 3a along a surface thereof at the upper hollow section side. The lower and upper electrodes 3b and 3c overlap each other at the flat central portion. Part of the piezoelectric layer 3a corresponding to the overlapped portion longitudinally vibrates when a voltage is applied from the electrodes 3b and 3c. Although the lower electrode 3b and the upper electrode 3c in this embodiment extend in the same direction as shown in FIG. 2, they can extend in directions crossing each other as shown in FIG. 3.

As shown in FIG. 2, the bulk acoustic wave element 3 has four through-holes 6 which extend between the lower hollow section 5 and the upper hollow section 7. It is preferable that the through-holes 6 are formed in the flat central portion of the piezoelectric layer 3a. In addition, the through-holes 6 can be formed so as to extend through the lower electrode 3b and the upper electrode 3c.

An electrode 13a is electrically connected to the lower electrode 3b of the bulk acoustic wave element 3 via a contact hole formed through the upper hollow section forming layer 9, the sealing layer 11, and the piezoelectric layer 3a. Another electrode 13b is electrically connected to the upper electrode 3c of the bulk acoustic wave element 3 via a contact hole formed through the upper hollow section forming layer 9 and the sealing layer 11.

Next, a method of manufacturing a bulk acoustic wave device in this embodiment will be described with reference to FIGS. 4-7, which are sectional views taken along line B-B of FIG. 2.

Figure 4:
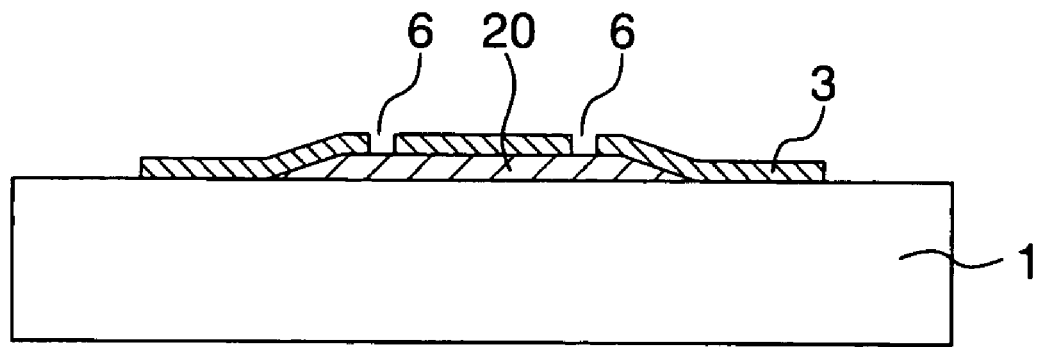
FIG. 4 is a sectional view showing a step of a method of manufacturing the bulk acoustic wave device according to the first embodiment.

First, as shown in FIG. 4, an insulating substrate 1 formed of insulating silicon, glass, etc. is prepared, and a hollow section forming layer 20 of amorphous silicon doped with phosphorus (P) is formed thereon. Then, patterning of the hollow section forming layer 20 is performed by lithography and reactive ion etching (RIE). Subsequently, a bulk acoustic wave device element 3 having the same structure as shown in FIG. 1, including a piezoelectric layer 3a, an upper electrode 3b, and a lower electrode 3c, is formed. At this time, a lower through-hole 6 reaching the hollow section forming layer 20 for removing the hollow section forming layer 20 by selective etching is formed in a part of the piezoelectric layer 3a.

Figure 5:
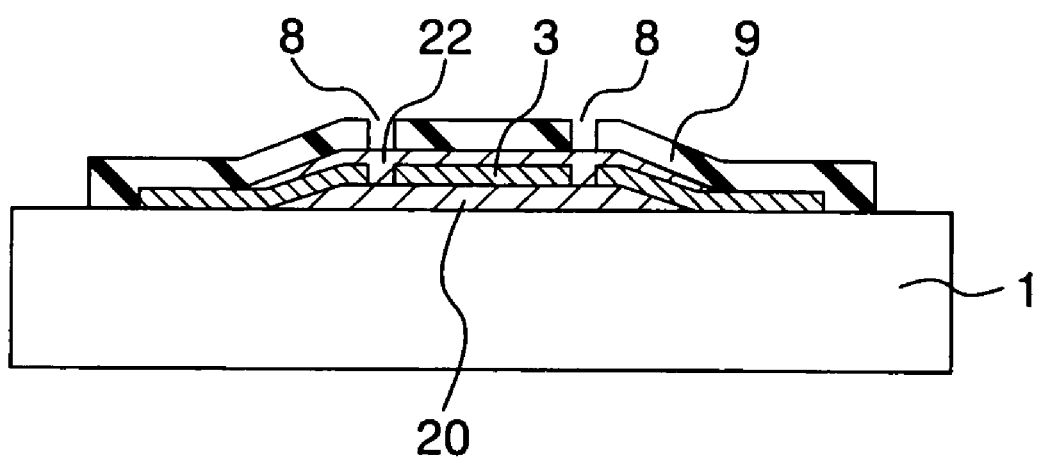
FIG. 5 is a sectional view showing a step of the method of manufacturing the bulk acoustic wave device according to the first embodiment.

Then, as shown in FIG. 5, a hollow section forming layer 22 is formed on the bulk acoustic wave element 3, which is patterned by lithography and reactive ion etching. Thereafter, an upper hollow section forming layer 9 of, e.g., an oxide layer, is formed by chemical vapor deposition (CVD) or vapor deposition, which is patterned by lithography and reactive ion etching. At this time, an upper through-hole 8 reaching the hollow section forming layer 22, for removing the hollow section forming layer 22 by selective etching, is formed in a part of the upper hollow section forming layer 9. Although the lower and upper through-holes 6 and 8 overlap each other in this embodiment, they can be formed so as not to overlap each other.

Figure 6:
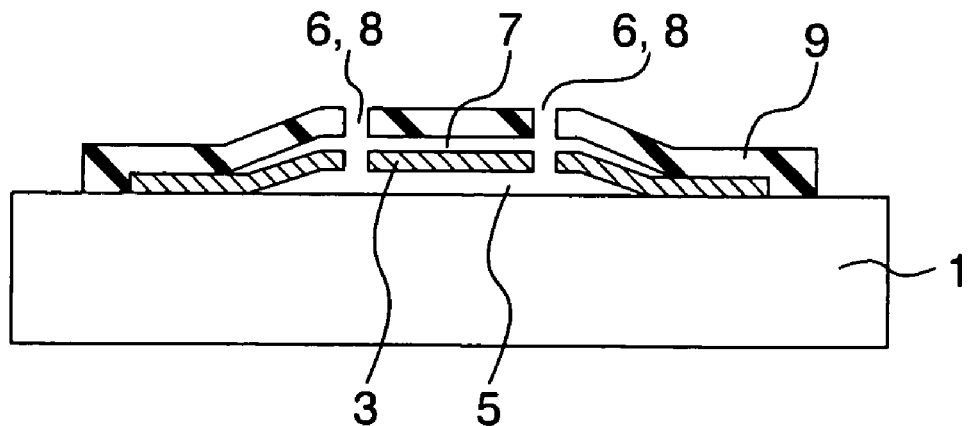
FIG. 6 is a sectional view showing a step of the method of manufacturing the bulk acoustic wave device according to the first embodiment.

Subsequently, as shown in FIG. 6, the hollow section forming layers 20 and 22 are simultaneously dissolved and removed using an etchant capable of selectively dissolving and removing only the hollow section forming layers 20 and 22, which is inserted through the upper through-hole 8 and the lower through-hole 6. As a result, an upper hollow section 7 and a lower hollow section 5 are formed above and below the bulk acoustic wave element 3.

Figure 7:
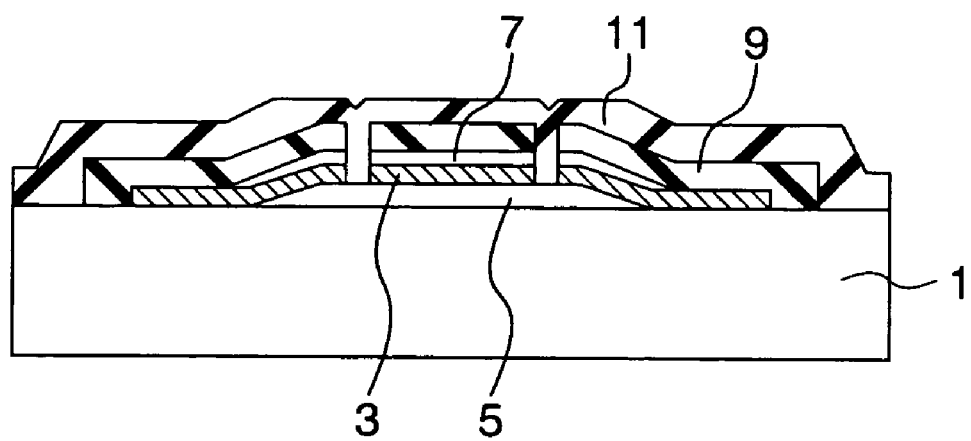
FIG. 7 is a sectional view showing a step of the method of manufacturing the bulk acoustic wave device according to the first embodiment.

Then, as shown in FIG. 7, a sealing layer 11 of, e.g., an oxide layer, is formed on the upper hollow section forming layer 9 by sputtering, etc., thereby filling up the through-holes 6 and 8, and sealing the bulk acoustic wave element 3.

As described above, it is possible to achieve a bulk acoustic wave device, which has hollow sections formed above and below a bulk acoustic wave element, and which is sealed, through a simple process. Therefore, unlike a conventional bulk acoustic wave device, the bulk acoustic wave device of this embodiment does not require being hermetically sealed in an expensive alumina package. Accordingly, it is possible to easily form a bulk acoustic wave device at a low cost. Further, the bulk acoustic wave device of this embodiment can be made thinner than a conventional one since it is not necessary to hermetically seal it in an alumina package, etc.

The bulk acoustic wave device of this embodiment has another advantageous effect in that the sealing layer 11 does not come off easily since the through-hole 6 is formed through the bulk acoustic wave element 3, and the through-hole 8 is formed through the upper hollow section forming layer 9.

Furthermore, a metal layer can be provided on the sealing layer 11 in order to shield high-frequency noise outputted from the bulk acoustic wave element 3.

Figure 9:
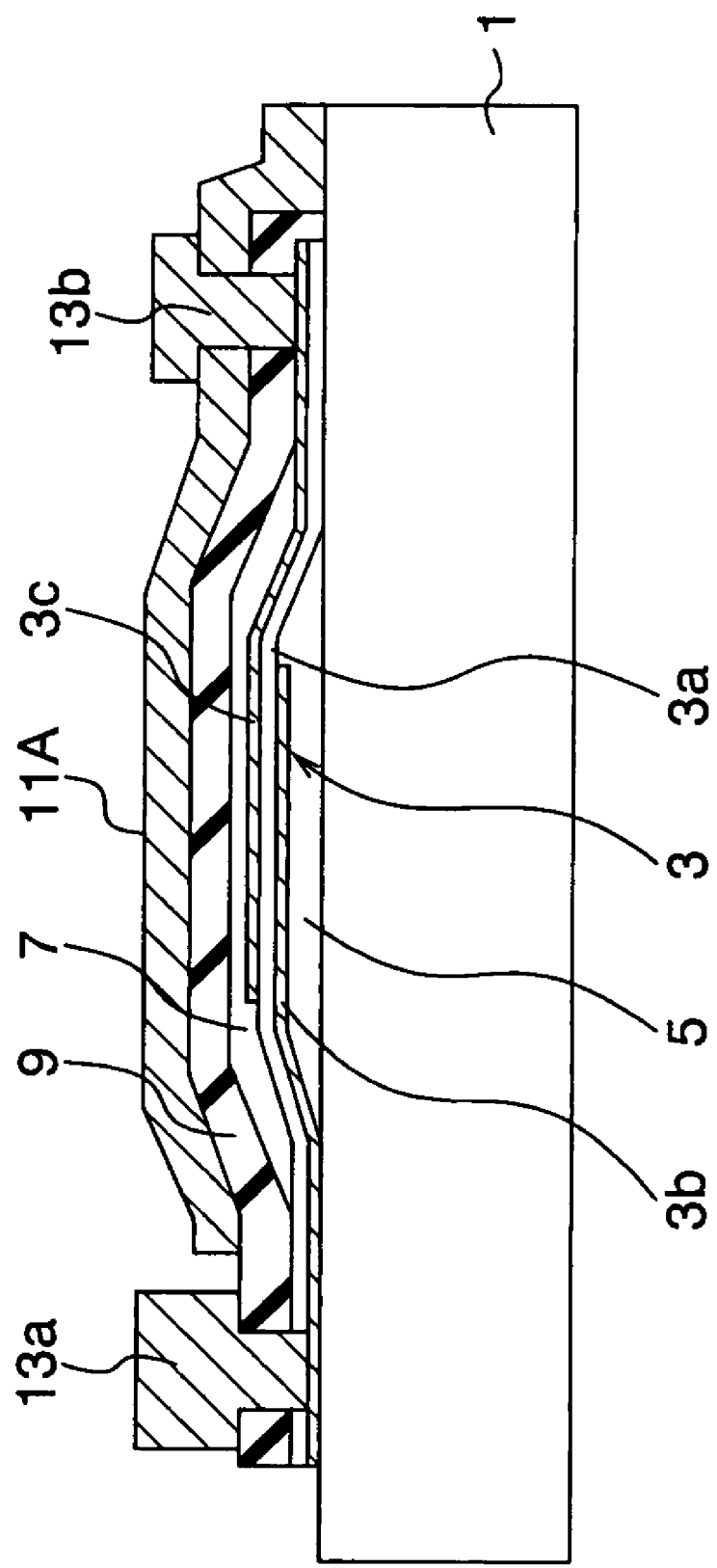
FIG. 9 is a sectional view showing the structure of a bulk acoustic wave device according to a second modification of the first embodiment.
Figure 10:
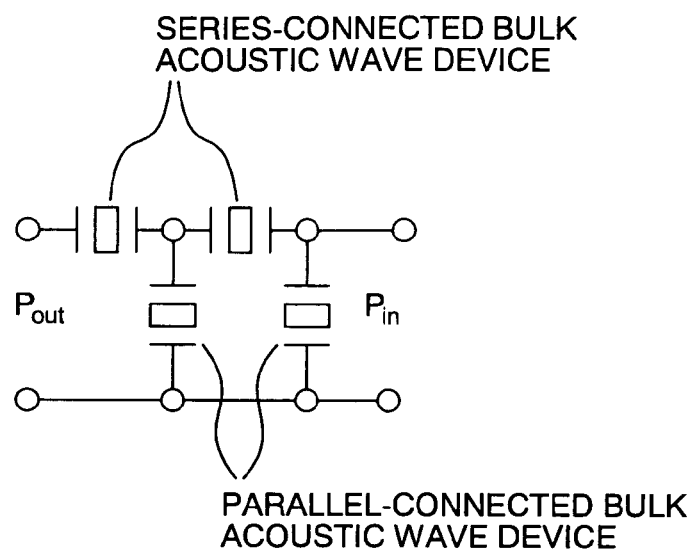
FIG. 10 is a circuit diagram showing the structure of a high-frequency filter circuit using bulk acoustic wave devices.
Figure 11:
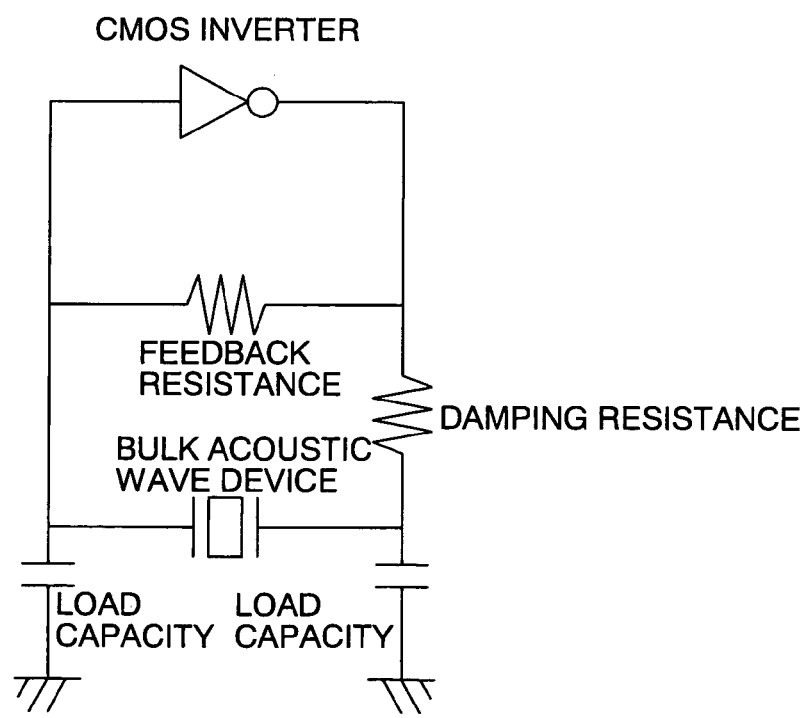
FIG. 11 is a circuit diagram showing an example of a circuit of a voltage controlled oscillator (VCO) using a bulk acoustic wave device.
Figure 12:
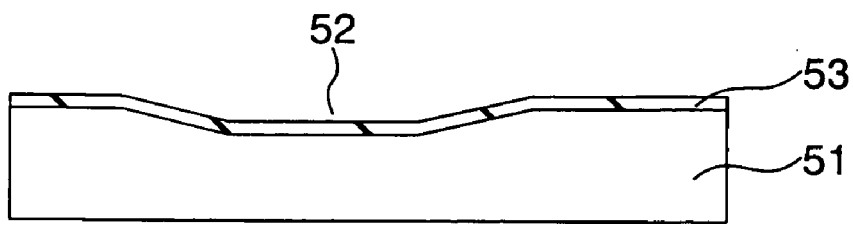
FIG. 12 is a sectional view showing a step of a method of manufacturing a conventional bulk acoustic wave device.
Figure 13:
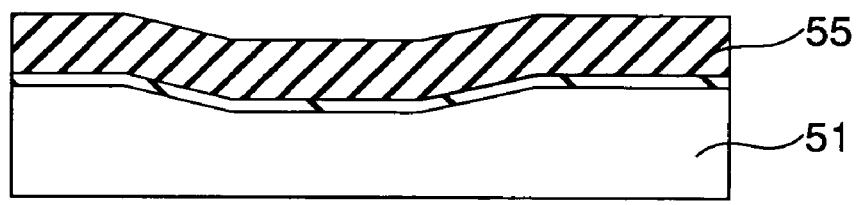
FIG. 13 is a sectional view showing a step of the method of manufacturing a conventional bulk acoustic wave device.
Figure 14:
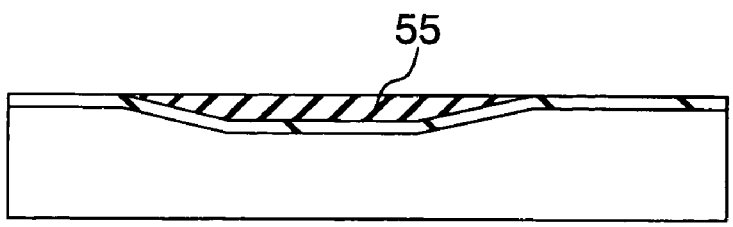
FIG. 14 is a sectional view showing a step of the method of manufacturing a conventional bulk acoustic wave device.
Figure 15:
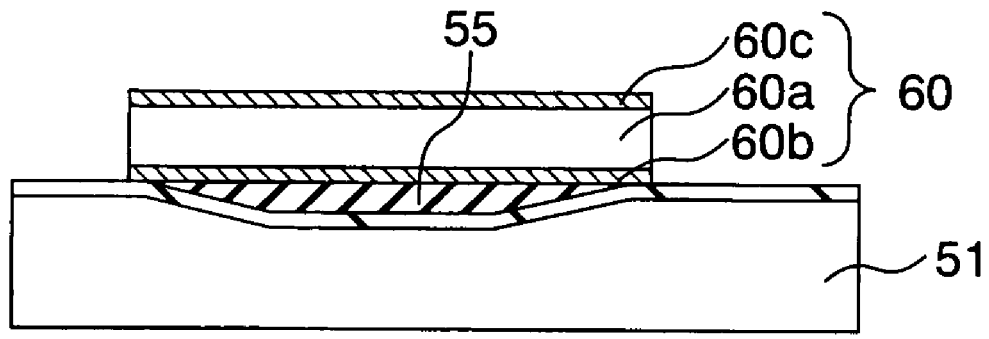
FIG. 15 is a sectional view showing a step of the method of manufacturing a conventional bulk acoustic wave device.
Figure 16:
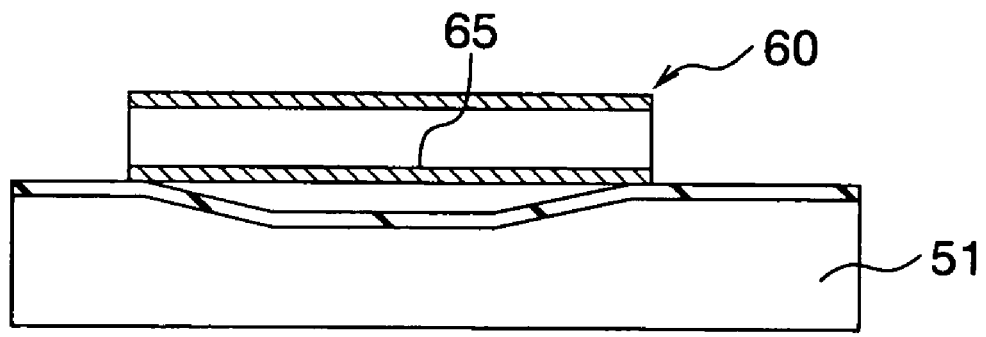
FIG. 16 is a sectional view showing a step of the method of manufacturing a conventional bulk acoustic wave device.
Figure 17:
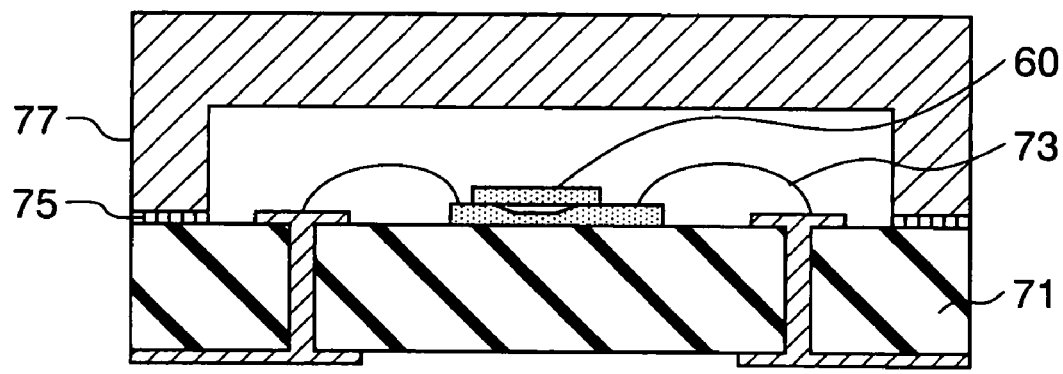
FIG. 17 is a sectional view of a hermetic sealing package of a conventional bulk acoustic wave device.

In this embodiment, if a recessed substrate as shown in FIG. 9 were used instead of the flat substrate 1, the bulk acoustic wave element 3 would be formed of flat layers.

The upper hollow section forming layer 9 and the sealing layer 11 can be formed of a thermoplastic resin. In this case, the upper hollow section forming layer 9 and the sealing layer 11 can be formed by the potting, spincoating, or laminating method. If the positions of the through-holes 6 and 8 were different, it would be preferable that the sealing layer 11 be formed by sputtering, using a material other than resin.

Figure 8:
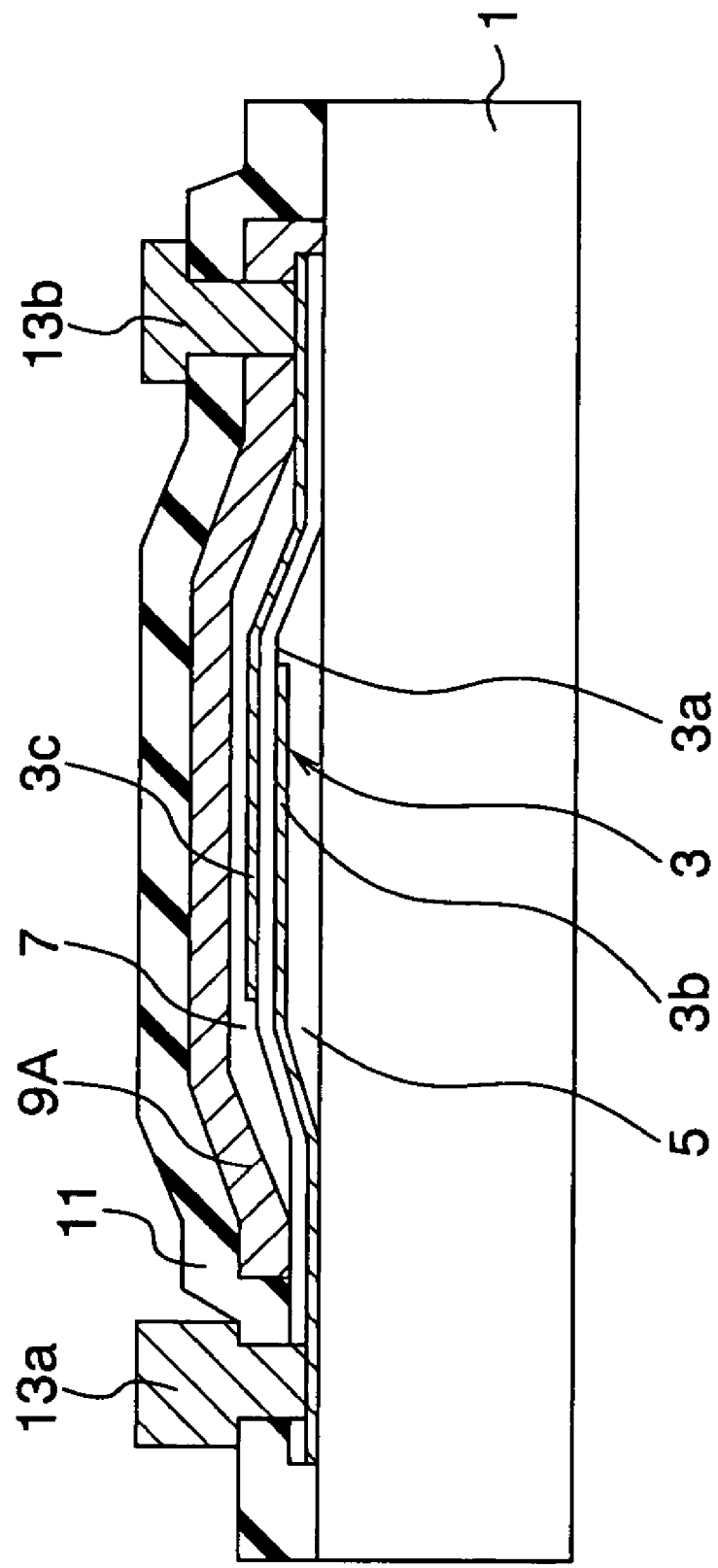
FIG. 8 is a sectional view showing the structure of a bulk acoustic wave device according to a first modification of the first embodiment.

As shown in FIG. 8, the upper hollow section forming layer 9A can be formed of a metal. In this case, it is necessary to electrically insulate at least one of the elecrodes 13a and 13b from the upper hollow section forming layer 9A. In FIG. 8, the electrode 13a is electrically insulated from the upper hollow section forming layer 9A.

Furthermore, as shown in FIG. 9, the sealing layer 11A can be formed of a metal. In this case, it is necessary to electrically insulate at least one of the elecrodes 13a and 13b from the sealing layer 11A. In FIG. 9, the electrode 13a is electrically insulated from the sealing layer 11A. If the sealing layer 11A were formed of a metal, it would be possible to shield high-frequency noise outputted from the bulk acoustic wave element 3.

Second Embodiment

Next, a bulk acoustic wave device according to the second embodiment of the present invention will be described with reference to FIGS. 18 to 28, which are sectional views showing the steps of a process of manufacturing the bulk acoustic wave device of this embodiment.

Figure 18:
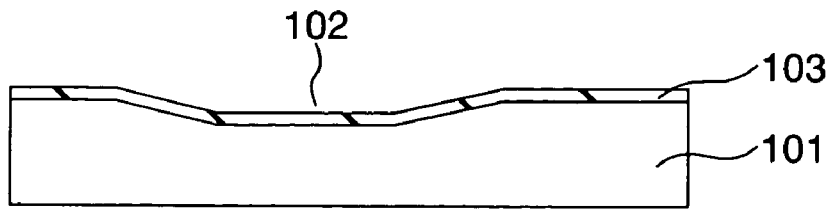
FIG. 18 is a sectional view showing a step of a method of manufacturing a bulk acoustic wave device according to the second embodiment of the present invention.
Figure 19:
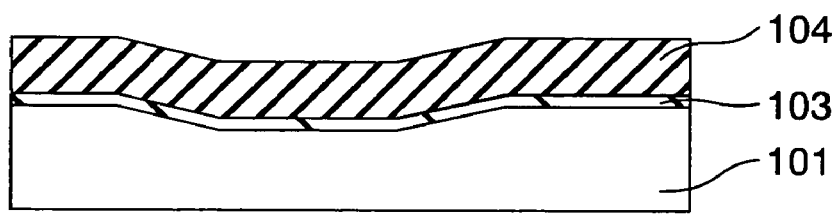
FIG. 19 is a sectional view showing a step of the method of manufacturing a bulk acoustic wave device according to the second embodiment of the present invention.
Figure 20:
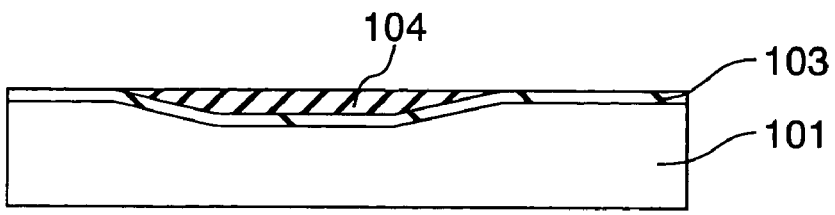
FIG. 20 is a sectional view showing a step of the method of manufacturing a bulk acoustic wave device according to the second embodiment of the present invention.

First, as shown in FIG. 18, a recess 102 is formed on an insulating substrate 101 of, e.g., silicon, by anisotropic etching. Then, an insulating layer 103 is formed so as to cover the recess 102. Thereafter, as shown in FIG. 19, a hollow section forming layer 104 of a silicate glass to which boron or phosphorus is doped (boron-phosphorus silicate glass=BPSG), and which is easy to etch, is formed on the insulating layer 103. Subsequently, as shown in FIG. 20, the hollow section forming layer 104 is polished and flattened until a surface of the insulating layer 103 is exposed, thereby leaving the hollow section forming layer 104 only in the recess 102 formed on the surface of the silicon substrate 101.

Figure 21:
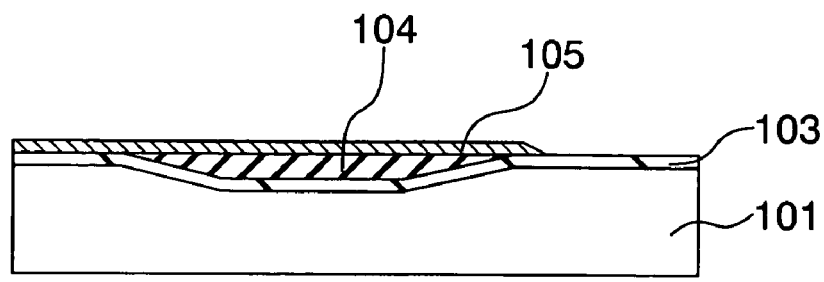
FIG. 21 is a sectional view showing a step of the method of manufacturing a bulk acoustic wave device according to the second embodiment of the present invention.
Figure 22:
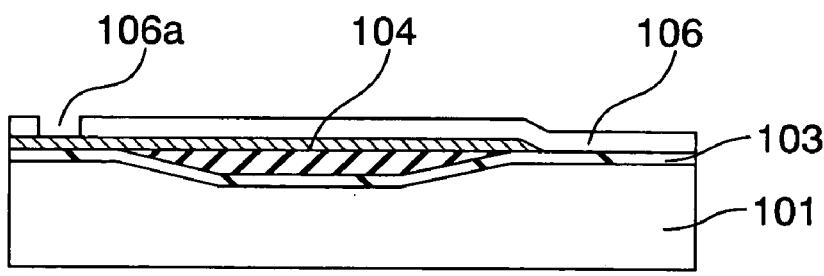
FIG. 22 is a sectional view showing a step of the method of manufacturing a bulk acoustic wave device according to the second embodiment of the present invention.

Then, an electrode material layer is formed on the entire surface of the substrate by sputtering, which is then patterned to form a lower electrode 105, as shown in FIG. 21. The lower electrode 105 covers a part of the hollow section forming layer 104. Thereafter, a piezoelectric material layer is formed on the entire surface by, e.g., reactive sputtering, which is then patterned by lithography to form a piezoelectric layer 106, as shown in FIG. 22. At this time, a contact hole 106 reaching the lower electrode 105, and, like the first embodiment, a first through-hole (not shown) reaching the hollow section forming layer 104 for removing the hollow section forming layer 104 by selective etching are formed through the piezoelectric layer 106.

Figure 23:
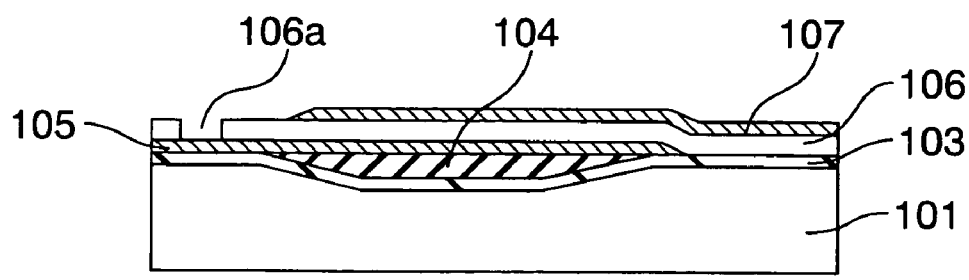
FIG. 23 is a sectional view showing a step of the method of manufacturing a bulk acoustic wave device according to the second embodiment of the present invention.

Thereafter, an electrode material layer is formed on the piezoelectric layer 106 by, e.g., sputtering, which is then patterned by lithography to form an upper electrode 107 as shown in FIG. 23. The upper electrode 107 is formed so as to overlap the lower electrode 105 above the recess 102 formed on the silicon substrate 101. A bulk acoustic wave element is formed of the lower electrode 105, the piezoelectric layer 106, and the upper electrode 107 thus formed.

Figure 24:
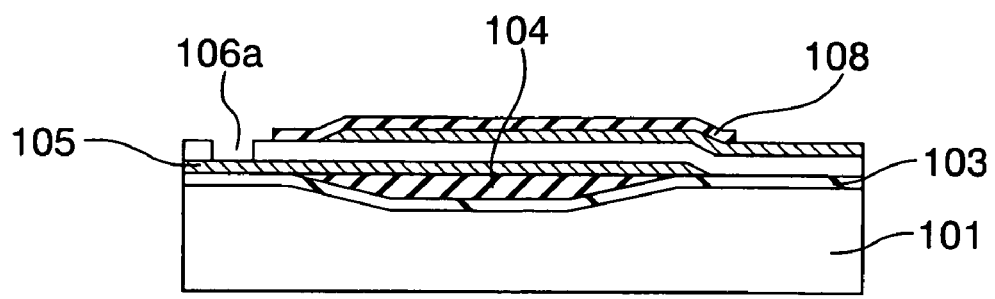
FIG. 24 is a sectional view showing a step of the method of manufacturing a bulk acoustic wave device according to the second embodiment of the present invention.
Figure 25:
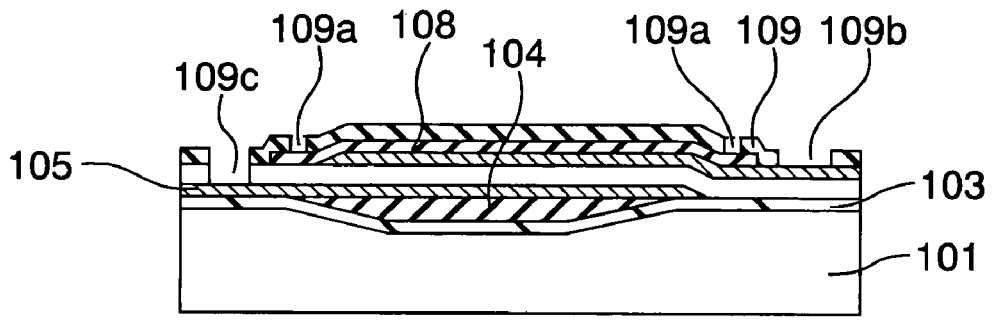
FIG. 25 is a sectional view showing a step of the method of manufacturing a bulk acoustic wave device according to the second embodiment of the present invention.

Subsequently, a hollow section forming layer 108 is formed so as to cover the upper electrode 107. The hollow section forming layer 108 is then patterned by lithography and reactive ion etching as shown in FIG. 24. Then, an oxide layer, for example, is formed so as to cover the hollow section forming layer 108, which is patterned by lithography and reactive ion etching to form an upper hollow section forming layer 109 as shown in FIG. 25. At this time, a second through-hole 109a reaching the hollow section forming layer 108 for removing the hollow section forming layers 108 and 104 by selective etching, a contact hole 109b reaching the upper electrode 107, and a contact hole 109c connecting to the contact hole 106a are formed through the upper hollow section forming layer 109.

Figure 26:
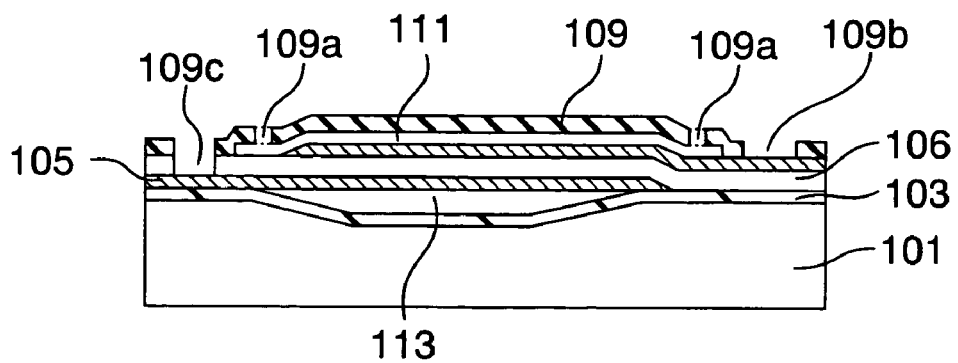
FIG. 26 is a sectional view showing a step of the method of manufacturing a bulk acoustic wave device according to the second embodiment of the present invention.

Next, as shown in FIG. 26, the hollow section forming layers 108 and 104 are selectively dissolved and removed at the same time using an etchant capable of selectively dissolving and removing only the hollow section forming layers 108 and 104, which is inserted through the first through-hole and the second through-hole. As a result, an upper hollow section 111 and a lower hollow section 113 are formed above and below the bulk acoustic wave element 105, 106, and 107.

Figure 27:
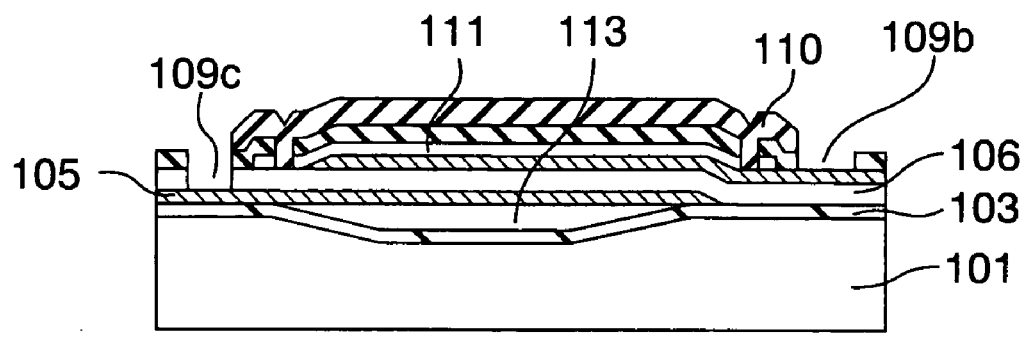
FIG. 27 is a sectional view showing a step of the method of manufacturing a bulk acoustic wave device according to the second embodiment of the present invention.
Figure 28:
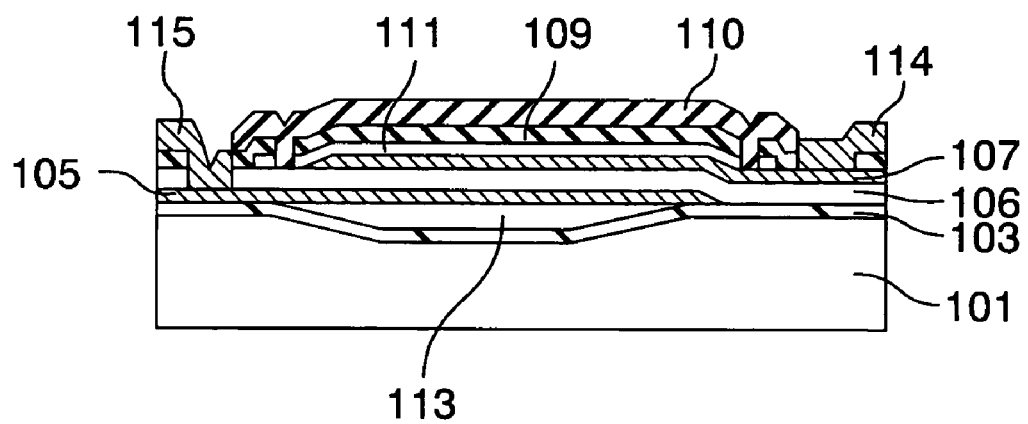
FIG. 28 is a sectional view showing a step of the method of manufacturing a bulk acoustic wave device according to the second embodiment of the present invention.

Then, an oxide layer, for example, is formed on the upper hollow section forming layer 109 by sputtering, etc., which is patterned to form a sealing layer 110 as shown in FIG. 27. The sealing layer 110 fills up the through-hole 109a, thereby sealing the bulk acoustic wave element 105, 106, and 107.

Thereafter, a layer of aluminum (Al), for example, is formed by sputtering so as to fill up the contact holes 109b and 109c. As show in FIG. 28, the Al layer is patterned by lithography and reactive ion etching in order to form a contact plug 114 electrically connected to the upper electrode 107, and a contact plug 115 electrically connected to the lower electrode 105, thereby completing the bulk acoustic wave device.

Thus, in this embodiment, it is possible to obtain a bulk acoustic wave device, in which the hollow sections 111 and 113 are formed above and below the resonating part of the bulk acoustic wave device, and sealed, with a simple process. Therefore, unlike a conventional device, it is not necessary to hermetically seal the device in an expensive alumina package, etc. Accordingly, it is possible to easily manufacture a bulk acoustic wave device at a low cost. In addition, since it is not necessary to hermetically seal the device in an alumina package, etc., the thickness of the bulk acoustic wave device of this embodiment can be made thinner, in comparison to conventional devices.

The bulk acoustic wave device of this embodiment also has an advantageous effect that the sealing layer 110 is hard to come off since the through-hole 109a is formed through the upper hollow section forming layer 109.

A metal layer can be provided on the sealing layer 110 in order to shield high-frequency noise outputted from the bulk acoustic wave element.

The upper hollow section forming layer 109 and the sealing layer 110 can be formed of a thermoplastic resin. In this case, the upper hollow section forming layer 109 and the sealing layer 110 can be formed by the potting, spincoating, or laminating method. If the positions of the first through-hole and the second through-hole 109a were different, it would be preferable that the sealing layer 110 be formed by sputtering, using a material other than resin.

As in the case of the first embodiment, the upper hollow section forming layer 109 can be formed of a metal. In this case, it is necessary to electrically insulate at least one of the electrodes 114 and 115 from the upper hollow section forming layer 109.

Furthermore, as in the case of the first embodiment, the sealing layer 110 can be formed of a metal. In this case, it is necessary to electrically insulate at least one of the electrodes 114 and 115 from the sealing layer 110. If the sealing layer 110 were formed of a metal, it would be possible to shield high-frequency noise outputted from the bulk acoustic wave element.

Third Embodiment

Next, a bulk acoustic wave device of the third embodiment will be described with reference to FIGS. 29 to 38, which are sectional views showing the steps of a method of manufacturing a bulk acoustic wave device of this embodiment.

The bulk acoustic wave device of the third embodiment is obtained by using a Bragg acoustic reflection layer instead of the hollow section below the bulk acoustic wave element of the bulk acoustic wave device of the second embodiment. The Bragg acoustic reflection layer can be formed by alternately stacking layers of two materials, which have as different as possible acoustic impedances, and each of which has a thickness of a fourth of the wavelength $\lambda$ of the resonance frequency of the bulk acoustic wave element. There is a drawback in providing a reflection layer in that the electromechanical coupling factor slightly decreases in comparison to the case where a hollow section is provided. However, there is an advantageous effect to this in that the number of manufacturing steps can be reduced.

Figure 29:
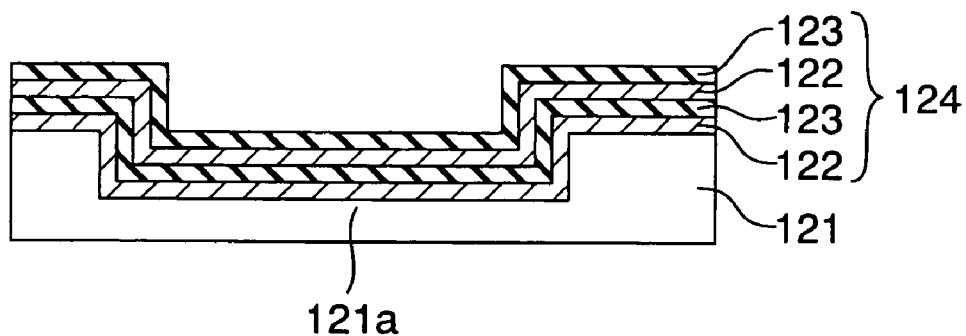
FIG. 29 is a sectional view showing a step of a method of manufacturing a bulk acoustic wave device according to the third embodiment of the present invention.

First, as shown in FIG. 29, a recess 121a is formed by anisotropic etching on an insulating substrate 121 of, e.g., silicon. Thereafter, a laminated layer 124 is formed by alternately stacking reflection layers 122 of, e.g., tungsten (W), and reflection layers 123 of, e.g., silicon oxide. The laminated layer fills up the recess 121a.

Figure 30:
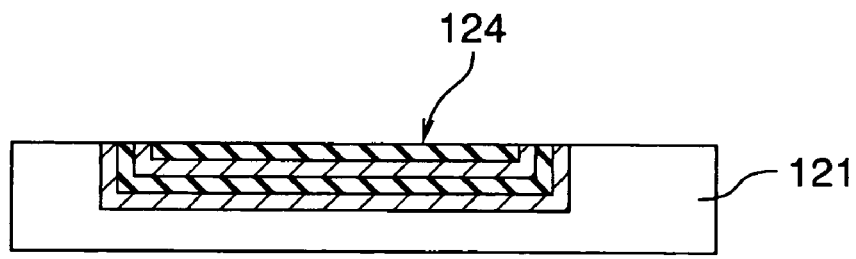
FIG. 30 is a sectional view showing a step of the method of manufacturing a bulk acoustic wave device according to the third embodiment of the present invention.
Figure 31:
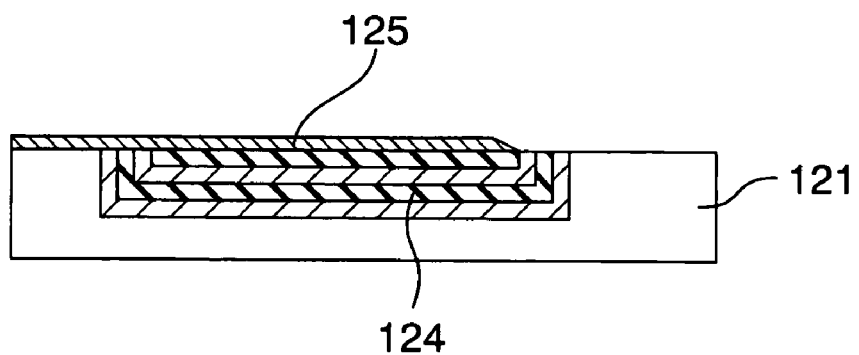
FIG. 31 is a sectional view showing a step of the method of manufacturing a bulk acoustic wave device according to the third embodiment of the present invention.

Then, as shown in FIG. 30, the laminated layer 124 is polished by, e.g., CMP, until a surface of the silicon substrate 121 is exposed, and then is flattened. Subsequently, an electrode material layer is formed by, e.g., sputtering, so as to cover the laminated layer 124. The electrode material layer is patterned by lithography in order to form a lower electrode 125 as shown in FIG. 31.

Figure 32:
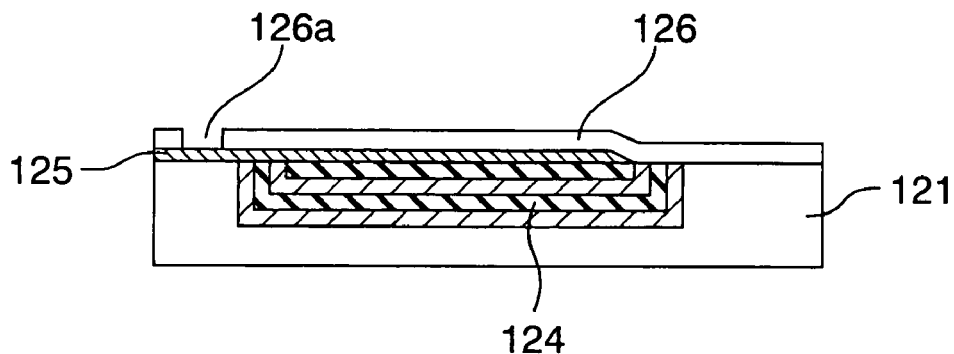
FIG. 32 is a sectional view showing a step of the method of manufacturing a bulk acoustic wave device according to the third embodiment of the present invention.

Thereafter, a piezoelectric material layer is formed on the substrate by, e.g., reactive sputtering. The piezoelectric material layer is then patterned by lithography in order to form a piezoelectric layer 126, through which a contact hole 126a reaching the lower electrode 125 is formed, as shown in FIG. 32.

Figure 33:
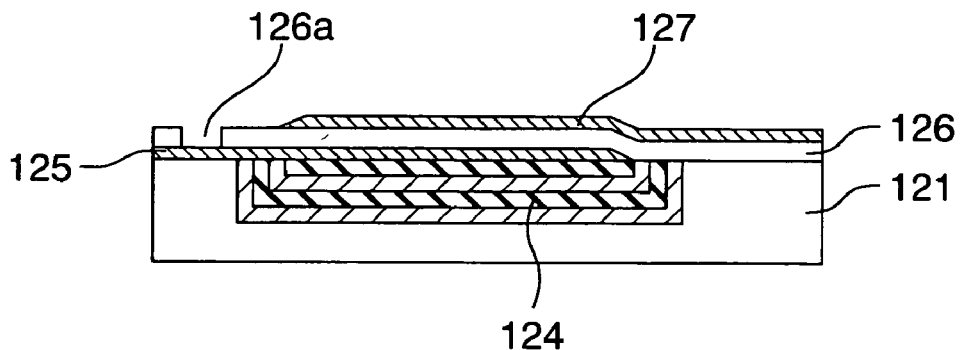
FIG. 33 is a sectional view showing a step of the method of manufacturing a bulk acoustic wave device according to the third embodiment of the present invention.

Then, an electrode material layer is formed on the piezoelectric layer 126 by, e.g., sputtering. The electrode material layer is patterned by lithography in order to form an upper electrode 127, as shown in FIG. 33. The upper electrode 127 is formed so as to overlap the lower electrode 125 above the laminated layer 124. A bulk acoustic wave element is composed of the lower electrode 125, the piezoelectric layer 126, and the upper electrode 127 thus formed.

Figure 34:
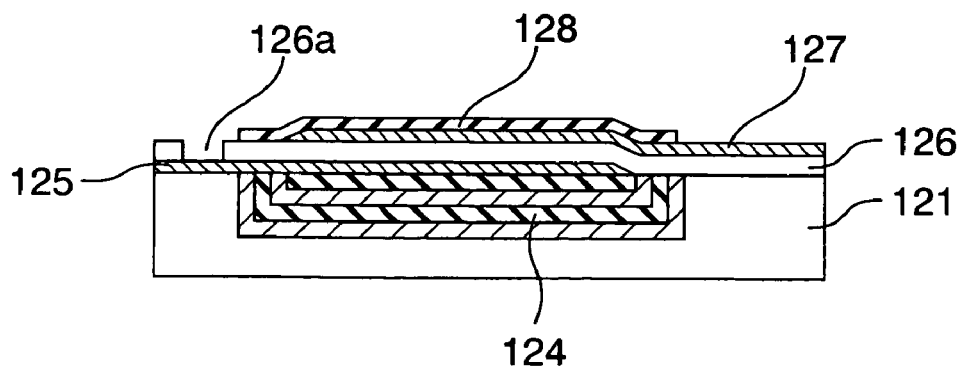
FIG. 34 is a sectional view showing a step of the method of manufacturing a bulk acoustic wave device according to the third embodiment of the present invention.
Figure 35:
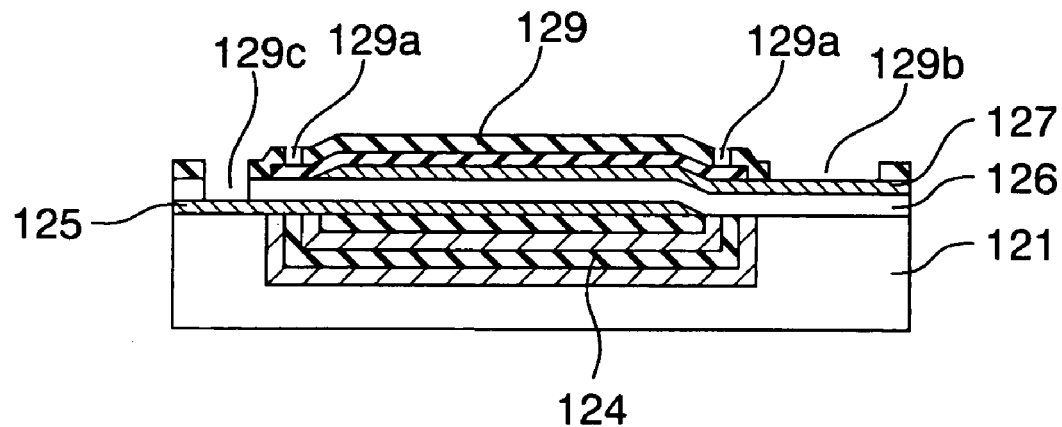
FIG. 35 is a sectional view showing a step of the method of manufacturing a bulk acoustic wave device according to the third embodiment of the present invention.

Subsequently, a hollow section forming layer 128 is formed so as to cover the upper electrode 127, which is then patterned by lithography and reactive ion etching, as shown in FIG. 34. Then, an oxide layer, for example, is formed so as to cover the hollow section forming layer 128. The oxide layer is then patterned by lithography and reactive ion etching, thereby forming a hollow section forming layer 129, as shown in FIG. 35. A through-hole 129a reaching the hollow section forming layer 128 for removing the hollow section forming layer 128 by selective etching, a contact hole 129b reaching the upper electrode 127, and a contact hole 129c connecting to the contact hole 126a are formed through the hollow section forming layer 129.

Figure 36:
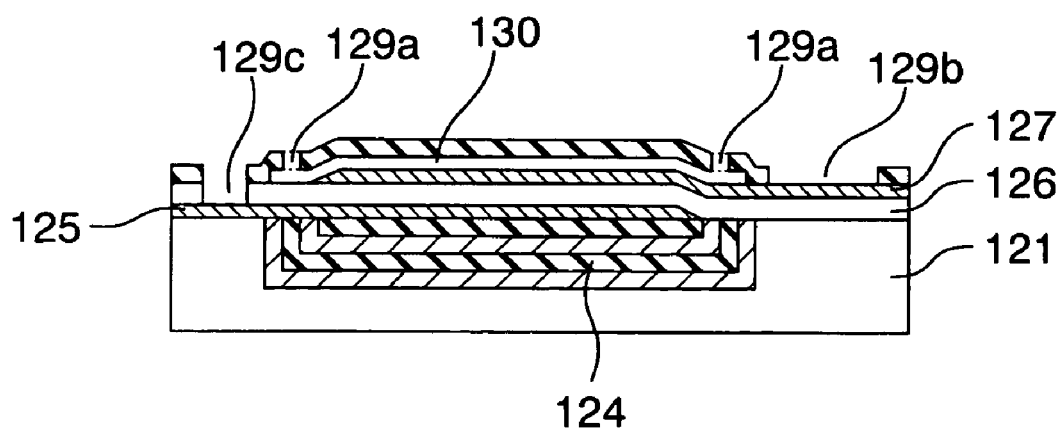
FIG. 36 is a sectional view showing a step of the method of manufacturing a bulk acoustic wave device according to the third embodiment of the present invention.

Thereafter, as shown in FIG. 36, the hollow section forming layer 128 is selectively dissolved and removed by inserting an etchant capable of selectively dissolving and removing only the hollow section forming layer 128 from the through-hole 129, thereby forming a hollow section 130 above the bulk acoustic wave element.

Figure 37:
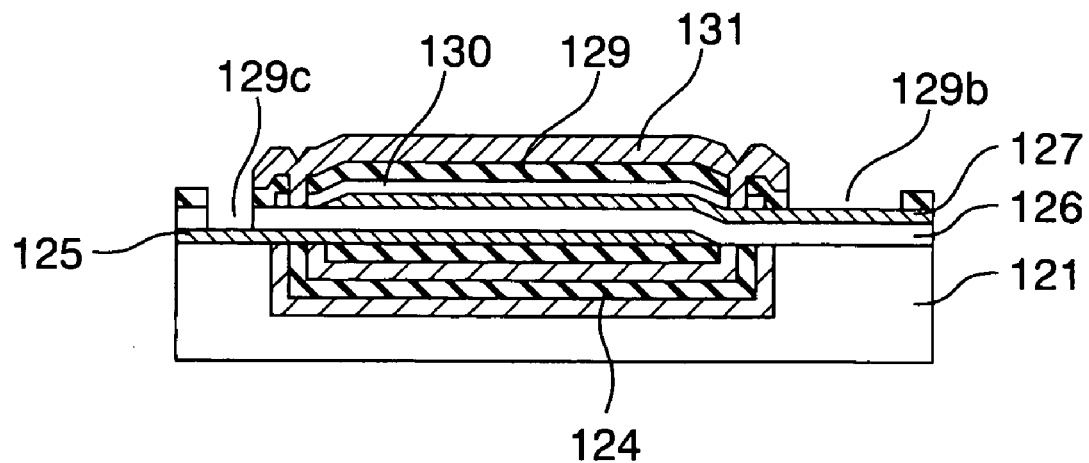
FIG. 37 is a sectional view showing a step of the method of manufacturing a bulk acoustic wave device according to the third embodiment of the present invention.
Figure 38:
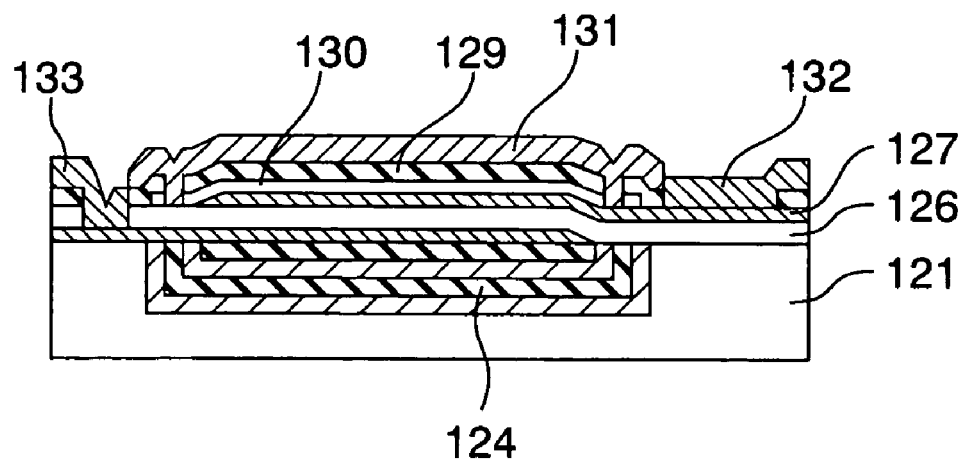
FIG. 38 is a sectional view showing a step of the method of manufacturing a bulk acoustic wave device according to the third embodiment of the present invention.

Then, an oxide layer, for example, is formed on the hollow section forming layer 129 by sputtering, etc. The oxide layer is patterned in order to form a sealing layer 131, as shown in FIG. 37. The sealing layer 131 fills up the through-hole 129a to seal the bulk acoustic wave element.

Subsequently, a layer of aluminum (Al), for example, is formed so as to fill up the contact holes 129b and 129c by sputtering. The Al layer is patterned by lithography and reactive ion etching in order to form a contact plug 132 electrically connected to the upper electrode 127 and a contact plug 133 electrically connected to the lower electrode 125, as show in FIG. 38, thereby completing the bulk acoustic wave device.

Thus, in this embodiment, it is possible to obtain a bulk acoustic wave device in which the laminated layer 124 composed of the acoustic reflection layer is formed below, and the hollow section 130 is formed above the resonating part of the bulk acoustic wave device with a simple process. Therefore, unlike a conventional device, it is not necessary to hermetically seal the device in an expensive alumina package, etc. Accordingly, it is possible to easily manufacture a bulk acoustic wave device at a low cost. In addition, since it is not necessary to hermetically seal the device in an alumina package, etc., the thickness of the bulk acoustic wave device of this embodiment can be made thinner in comparison to a conventional device.

The bulk acoustic wave device of this embodiment also has an advantageous effect that the sealing layer 131 does not come off easily since the through-hole 129a is formed through the hollow section forming layer 129.

A metal layer can be provided on the sealing layer 131 in order to shield high-frequency noise outputted from the bulk acoustic wave element.

The hollow section forming layer 129 and the sealing layer 131 can be formed of a thermoplastic resin. In this case, the hollow section forming layer 129 and the sealing layer 131 can be formed by the potting, spincoating, or laminating method.

As in the case of the first embodiment, the hollow section forming layer 129 can be formed of a metal. In this case, it is necessary to electrically insulate at least one of the electrodes 132 and 133 from the hollow section forming layer 129.

Furthermore, as in the case of the first embodiment, the sealing layer 131 can be formed of a metal. In this case, it is necessary to electrically insulate at least one of the electrodes 132 and 133 from the sealing layer 131. If the sealing layer 131 were formed of a metal, it would be possible to shield high-frequency noise outputted from the bulk acoustic wave element.

Thus, according to the embodiments of the present invention, it is possible to obtain a bulk acoustic wave device which is easy to manufacture at a low cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A bulk acoustic wave device comprising:
  a bulk acoustic wave element including a piezoelectric layer formed on a substrate, a lower electrode contacting a lower surface of the piezoelectric layer, and an upper electrode contacting an upper surface of the piezoelectric layer and partially overlapping the lower electrode, a lower hollow section being formed between the substrate and the lower surface of the piezoelectric layer, a first through-hole reaching the lower hollow section being formed through the bulk acoustic element in a direction perpendicular to a surface of the piezoelectric layer;
  an upper hollow section forming layer forming an upper hollow section with the upper surface of the piezoelectric layer, a second through-hole reaching the upper hollow section being formed therethrough in a direction perpendicular to a surface thereof; and
  a sealing layer covering the upper hollow section forming layer and filling up the second through-hole.

2. The bulk acoustic wave device according to claim 1, wherein the first through-hole and the second through-hole overlap each other.

3. The bulk acoustic wave device according to claim 1, wherein edge portions of the piezoelectric layer are flat, the piezoelectric layer is spaced incrementally apart from the substrate from the edge portions toward a central portion, the central portion is flat, and overlapping portions of the lower electrode and the upper electrode is located at the flat portion of the central portion.

4. The bulk acoustic wave device according to claim 1, wherein at least a surface of the sealing layer is formed of a metal.

5. A bulk acoustic wave device comprising:
  a bulk acoustic wave element including a piezoelectric layer formed on a substrate, on which a recess is formed, a lower electrode contacting a lower surface of the piezoelectric layer, and an upper electrode contacting an upper surface of the piezoelectric layer and partially overlapping the lower electrode, a lower hollow section being formed between the recess of the substrate and the lower surface of the piezoelectric layer, a first through-hole reaching the lower hollow section being formed through the bulk acoustic wave element in a direction perpendicular to a surface of the piezoelectric layer;
  an upper hollow section forming layer forming an upper hollow section with the upper surface of the piezoelectric layer, a second through-hole reaching the upper hollow section being formed therethrough in a direction perpendicular to a surface thereof; and
  a sealing layer covering the upper hollow section forming layer and filling up the second through-hole.

6. The bulk acoustic wave device according to claim 5, wherein the piezoelectric layer is flat.

7. The bulk acoustic wave device according to claim 5, wherein at least a surface of the sealing layer is formed of a metal.

8. A bulk acoustic wave device comprising:
an acoustic reflection layer formed on a substrate;
a bulk acoustic wave element including a piezoelectric layer covering the acoustic reflection layer, a lower electrode contacting a lower surface of the piezoelectric layer, and an upper electrode contacting an upper surface of the piezoelectric layer and partially overlapping the lower electrode;
a hollow section forming layer forming a hollow section with the upper surface of the piezoelectric layer, a through-hole reach the hollow section being formed in a direction perpendicular to a surface of the hollow section forming layer; and
a sealing layer covering the hollow section forming layer and filling up the through-hole.

9. The bulk acoustic wave device according to claim 8, wherein the piezoelectric layer is flat.

10. The bulk acoustic wave device according to claim 8, wherein the acoustic reflection layer is a Bragg acoustic reflection layer.

11. The bulk acoustic wave device according to claim 8, wherein the acoustic reflection layer is embedded in the substrate.

12. The bulk acoustic wave device according to claim 8, wherein at least a surface of the sealing layer is formed of a metal.

* * * * *